US011734485B1

(12) United States Patent
Posser et al.

(10) Patent No.: US 11,734,485 B1
(45) Date of Patent: Aug. 22, 2023

(54) ROUTING CONGESTION BASED ON FRACTIONAL VIA COST AND VIA DENSITY

(71) Applicant: Cadence Design Systems, Inc., San Jose, CA (US)

(72) Inventors: Gracieli Posser, Austin, TX (US); Derong Liu, Austin, TX (US); Mehmet Can Yildiz, Austin, TX (US); Zhuo Li, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 168 days.

(21) Appl. No.: 17/314,932

(22) Filed: May 7, 2021

(51) Int. Cl.
*G06F 30/394* (2020.01)
*G06F 30/392* (2020.01)
*G06F 30/398* (2020.01)

(52) U.S. Cl.
CPC .......... *G06F 30/394* (2020.01); *G06F 30/392* (2020.01); *G06F 30/398* (2020.01)

(58) Field of Classification Search
CPC . H01L 2224/05647; H01L 2224/08058; H01L 2224/08145; H01L 2224/09181; H01L 2224/16146; H01L 2224/17181; H01L 2224/481; H01L 2224/73201; H01L 2224/80006; H01L 2224/8013; H01L 2224/80132; H01L 2224/80357; H01L 2224/80895; H01L 2224/80896; H01L 2224/94; H01L 2225/0651; H01L 2225/06517; H01L 2225/06524; H01L 2225/06589; H01L 23/3677; H01L 23/473; H01L 24/08; H01L 24/80; H01L 25/0657; H01L 25/18; H01L 25/50; H01L 27/0688; H01L 2924/00014; H01L 2224/08; H01L 2224/48; H01L 2224/80001; H01L 23/46; H01L 23/528; H01L 2924/00; H01L 2924/0002; H01L 2223/6627; H01L 2223/6677; H01L 2224/13099; H01L 2224/45099; H01L 2224/8082; H01L 23/66; H01L 27/0207; H01L 27/105; H01L 27/10897; H01L 2924/1431; H01L 2924/1436; H01L 2924/1443; G03F 1/36; G03F 1/70; G06F 18/2178; G06F 18/217; G06F 18/21; G06F 18/25; G06F 17/18; G06F 16/2477; G06F 18/00; G06F 2211/005; G06F 2218/00; G06F 16/2379; G06F 16/24; G06F 16/245; G06F 3/011;
(Continued)

(56) References Cited

U.S. PATENT DOCUMENTS 8,065,652 B1 * 11/2011 Salowe ................. G06F 30/394
716/120
10,885,257 B1 * 1/2021 Posser .................. G06F 30/398
10,997,352 B1 * 5/2021 Posser .................. G06F 30/327

* cited by examiner

*Primary Examiner* — Binh C Tat
(74) *Attorney, Agent, or Firm* — Schwegman Lundberg & Woessner, P.A.

(57) ABSTRACT

Various embodiments provide for routing a circuit design using routing congestion based on fractional via cost, via density, or both in view of one or more design rules. For instance, some embodiments model via cost based on one or more design rules to determine routing congestion, where routing demand (e.g., routing capacity occupied by) of a via is fractional to the amount of the track blocked by the via. Additionally, some embodiments apply via density modeling based on one or more design rules to determine a routing demand of a via for routing congestion.

20 Claims, 11 Drawing Sheets

(58) Field of Classification Search
CPC .. G06F 3/017; G06F 2203/011; G06F 3/0346; G06F 2203/012; G06F 2203/04806; G06F 2203/04808; G06F 3/013; G06F 3/0304; G06F 3/04845; G06F 3/04847; G06F 3/04883; G06F 30/394
USPC .................................................. 716/126–131
See application file for complete search history.

US 11,734,485 B1

ROUTING CONGESTION BASED ON FRACTIONAL VIA COST AND VIA DENSITY

TECHNICAL FIELD

Embodiments described herein relate to circuit design and, more particularly, to systems, methods, devices, and instructions for routing a circuit design using routing congestion based on fractional via cost, via density, or both, which may be part of electronic design automation (EDA).

BACKGROUND

EDA software systems commonly perform routing of networks of circuit designs, such as clock networks (hereafter, clock nets). Usually, a network of a circuit design comprises a set of pins, and a routing process can route a path to connect the network. Net routing can be performed in two phases, where the first phase involves routing guides (e.g., global routing paths) that attempt to generate timing-aware/timing-based global routing of nets, and the second phase involves detailed routing of nets with specific wires (e.g., metal traces) based on the routing guides, while attempting to resolve/avoid one or more design rule violations. Additionally, congestion estimation can be performed to assist placement in spreading routing congestion in the critical locations.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
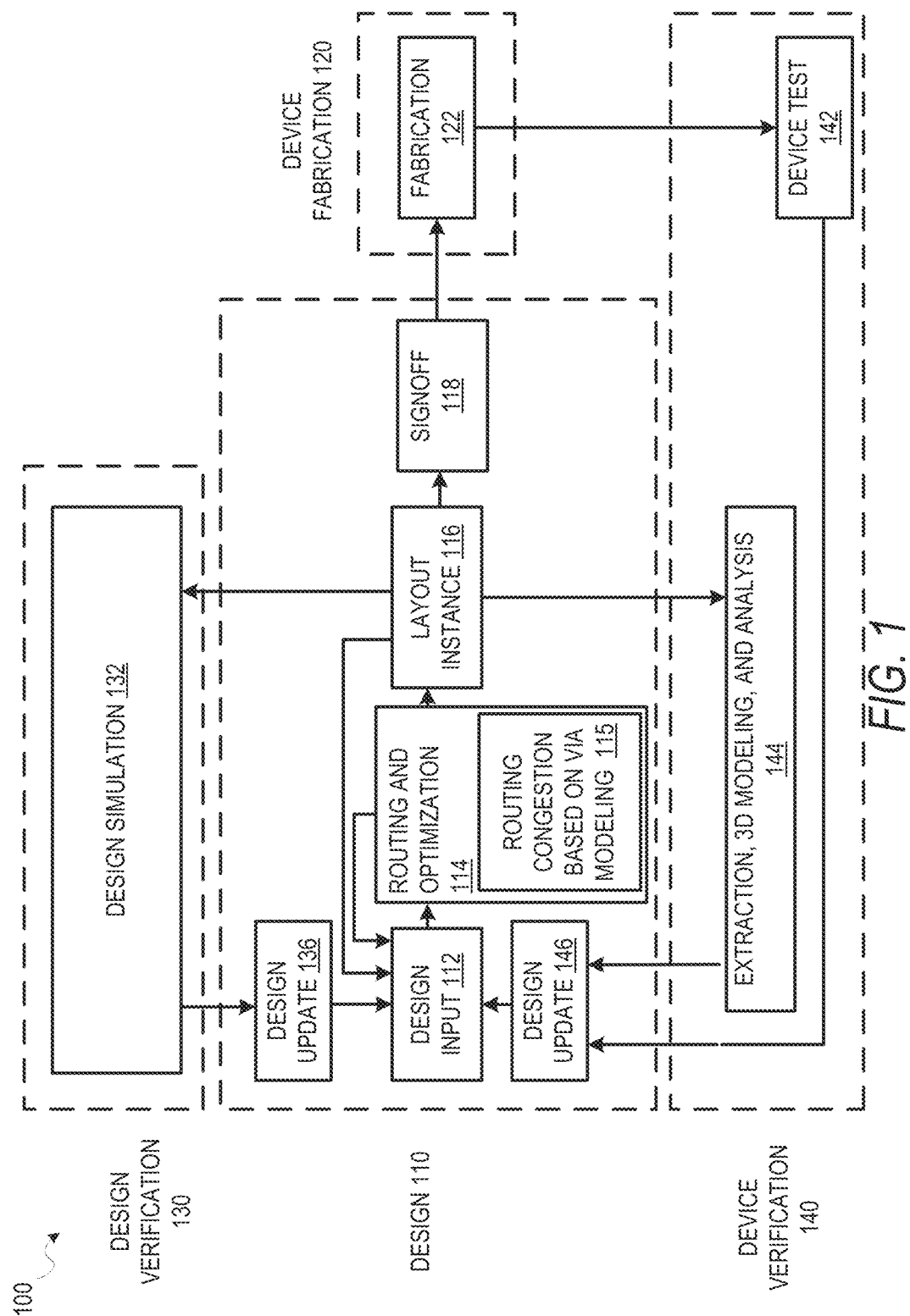
FIG. 1 is a diagram illustrating an example design process flow that uses routing congestion based on fractional via cost, via density, or both, according to some embodiments.

Various embodiments provide for routing a circuit design using routing congestion based on fractional via cost, via density, or both, which may be part of EDA. More specifically, some embodiments determine routing congestion (e.g., as part of a global routing process) by modeling via cost based on one or more design rules, where the modeling considers how much routing resource a via (e.g., on each layer) of a circuit design will occupy while satisfying the one or more design rules, and where the modeling has a via (e.g., stack via) take a fractional routing capacity (e.g., have a routing demand) based on the amount the via blocks on a track of a grid cell. Some embodiments determine routing congestion (e.g., as part of a global routing process) by modeling via cost based on one or more design rules, where the modeling applies via density modeling based on the one or more design rules to determine a routing demand of a via.

Global routing can comprise two-dimensional (2D) net routing, layer assignment of wires of nets, or track assignment of wires of nets. Resolving congestion and major design rule constraints (DRCs) during global routing can facilitate detailed routing of nets. Conventional global routing can route nets of a circuit design by dividing the circuit design (e.g., each layer of the circuit design) into a grid of cells (also referred to as "global routing cells," "grid cell," or "g-cells"), where each grid cell comprises a set number of resources (e.g., horizontal and vertical resources, such as tracks) for routing a net, referred to as capacity, and a number of resources that are currently being used or demanded by global routing to route a network, referred to as routing demand or demand. A cell can be square or rectangular in shape. Routing overflow (or overflow) for a given grid cell is usually determined by subtracting the demand for the given grid from the capacity of the given grid, where an overflow comprising a negative number indicates more demand for routing resources than available capacity of resources. A grid cell can be considered congested if a number of resources of the grid cell is less than what is needed to route a network through the grid cell, which is indicated by a negative number for overflow.

Based on the grid of cells, global routing can route a net of the circuit design by assigning the net to a set of specific grid cells and a set of specific layers (metal layer) of the circuit design. Generally, using grid cells permits global routing to speed up the process of finding the net routing solutions by analyzing routing congestion based on grid cell congestion and by reducing the number of pathways to consider for net routing.

During a global routing process, via modeling is often used to perform congestion estimation. As the design rules for circuit designs are becoming more complex over time, so does the need for accurate congestion estimation to achieve design closure. Unfortunately, conventional via modeling typically uses a pre-defined cost for congestion modeling, does not take design rules into account, and does not consider via density (so regions of a circuit design with a higher number of vias do not have any extra penalty other than regular via cost).

EDA tools often use a global routing process (e.g., via a global routing engine) to estimate routing congestion and optimize routability of a circuit design using a congestion map. During a conventional global routing process, a via (connecting to two layers of a circuit design) within a grid cell is considered as taking a full track of routing demand with respect to that grid cell. Conventional global routing processes usually operate this way despite the fact that routing demand costs of two vias can vary based on design rules being respectively applied to the two vias. Generally, the number of design rules applied to two different vias of a circuit design can vary.

Various embodiments described herein enable a global routing process to determine a routing demand/cost of a via that better reflects design rules and routing difficulty of that via. In particular, various embodiments described herein provide a method for routing a circuit design using routing congestion based on fractional via cost, via density, or both in view of one or more design rules. For instance, some embodiments model via cost based on one or more design rules to determine routing congestion, where routing demand (e.g., routing capacity occupied by) a via is fractional to the amount of the track blocked by the via. For example, an embodiment can consider (e.g., use) a different routing demand for a stack via within a grid cell (e.g., track demand of 50% for the grid cell) compared to a non-stack via within a grid cell (e.g., track demand of 100% for the grid cell). Additionally, some embodiments apply via density modeling based on one or more design rules to determine a routing demand of a via for routing congestion. For instance, if a via has a more restrictive design rule, an embodiment can apply a higher weight in the density calculation for the via density modeling.

Depending on the embodiment, determining routing congestion based on fractional via cost as described herein can be performed as part of global routing and prior to detailed routing.

Various embodiments described herein can enable circuit design routing (e.g., global routing) to be aware of via routing rules in the early stages of circuit design routing (e.g., early stages of global routing), consider vias that take different amounts of resources in a track (e.g., consider vias that take less of a track than a bigger via, such as stack vias), and consider density of vias within grid cells. In doing so, various embodiments can enable detection of grid cell congestion with improved accuracy, which results in more accurate congestion map data than otherwise possible. This can improve a computer system's ability to perform global routing and can reduce congestion and design violation that result at the end of global routing. Various embodiments described herein represent an improvement over conventional circuit design routing (e.g., global routing) techniques, which typically do not consider fractional via costs or via density.

As used herein, global routing can comprise determining a routing plan (e.g., one or more routing guides) for routing a physical wire (e.g., interconnect line or wire) within a circuit design between two or more nodes of circuit design (e.g., two pins or a source and a pin), For instance, global routing can route a wire (of a net of the circuit design) within the circuit design by dividing the circuit design (e.g., dividing each of one or more layers of the circuit design) into a grid of cells (e.g., grid cells), where each cell comprises a set number of resources (e.g., horizontal and vertical resources, such as tracks) for routing the wire. For some embodiments, each layer of a circuit design comprises its own grid of cells (e.g., grid cells). Additionally, for some embodiments, a routing blockage of a circuit design (e.g., on a layer of the circuit design) is marked with respect to a cell (e.g., grid cell) in the grid. Global routing can consider/account for one or more routing blockages of the circuit design when determining a route plan for a wire within the circuit design.

Global routing can route a wire (of the net) by assigning the net to a set of specific cells and a set of specific layers (metal layers) of the circuit design. In doing so, global routing can generate a routing plan for the wire that describes a set of connected cells (e.g., grid cells), between two or more nodes of the circuit design, that does not include obstructed cells. The routing plan (e.g., global routing plan) can comprise one or more routing guides that serve as "loose" routing paths or routing areas within which detailing routing can route a physical wire between two or more nodes (e.g., pins) of a circuit design.

As used herein, a routing blockage (or routing obstacle) can comprise a defined area of a circuit design that serves as an obstruction with respect to routing (e.g., routing a wire associated with a network of the circuit design, such as a clock net) through the defined area. For example, a routing blockage can be caused by a macro block included by a circuit design, which may be associated with a circuit design intellectual property (IP) block. A given routing blockage can comprise an area covering one or more layers of a circuit design (e.g., layers M1, M2, and M3). For various embodiments, circuit design routing routes a wire around a routing blockage.

As used herein, detailed routing can comprise routing a physical wire (e.g., interconnect wire) within a circuit design, between two or more nodes of the circuit design, based on a routing plan determined by global routing for the circuit design. The routing plan can provide a detailed routing process with a topology for routing wires, which in turn can enable detailed routing to route wires without violating one or more DRCs associated with a circuit design. This can be referred to as detailed routing being performed with clean DRCs. Accordingly, for some embodiments, global routing is performed on a circuit design prior to detailed routing being performed on the circuit design. Generally, global routing can be performed on a circuit design faster than performing detailed routing on the same circuit design. The routed wires of a circuit design can form a network of the circuit design.

As used herein, a congestion map can describe a measure (e.g., estimated measure) of routing congestion for a set of grid cells on layer(s) (e.g., metal layers) of a circuit design, where the layers serve as interconnect structures for the circuit design. A measure of routing congestion for a given grid cell can be represented by one or more congestion ratios, such as one ratio for a horizontal routing resource and another ratio for a vertical routing resource. For example, a congestion ratio for a horizontal routing resource of a given grid can comprise a total number of horizontal routing resources demanded from the given grid cell by circuit elements (e.g., logical devices of the circuit design) within the given grid cell, divided by a total number of horizontal routing resources available (supplied) by the given grid cell. A congestion map can be implemented as a data structure, such as a 2D array, for storing measured interconnect congestion for individual cells of the set of grid cells.

As used herein, a capacity map can describe a measure of routing resource capacity of a set of grid cells for layer(s) of a circuit design, such as horizontal and. vertical resources (e.g., tracks) for routing a wire through each grid cell. For some embodiments, a capacity map is used by global routing to generate a set of routing guides between at least two nodes of the circuit design (e.g., between two pins or between a source and a pin). A capacity map for a circuit design can be generated based on a congestion map. As used herein, via capacity for a given grid cell can describe a capacity available in the given grid cell for vias.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 that uses routing congestion based on fractional via cost, via density, or both, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed. in a routing and optimization 114 operation, along with any other automated design processes. The routing and optimization 114 operation may also include other operations not shown, such as those relating to floorplanning, placement, post-placement optimization, and post-routing optimization. As shown, the routing and optimization 114 operation includes routing congestion based on via modeling operation 115, which may be performed in accordance with various embodiments described herein. For some embodiments, operation 115 can be performed prior to detailed routing of a circuit design and, more particularly, during (e.g., as part of) global routing of the circuit design.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation through a process, such as logic-synthesis to generate a circuit netlist mapped to a target standard library manufacturable by the foundry in fabrication 122. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, three-dimensional (3D) modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
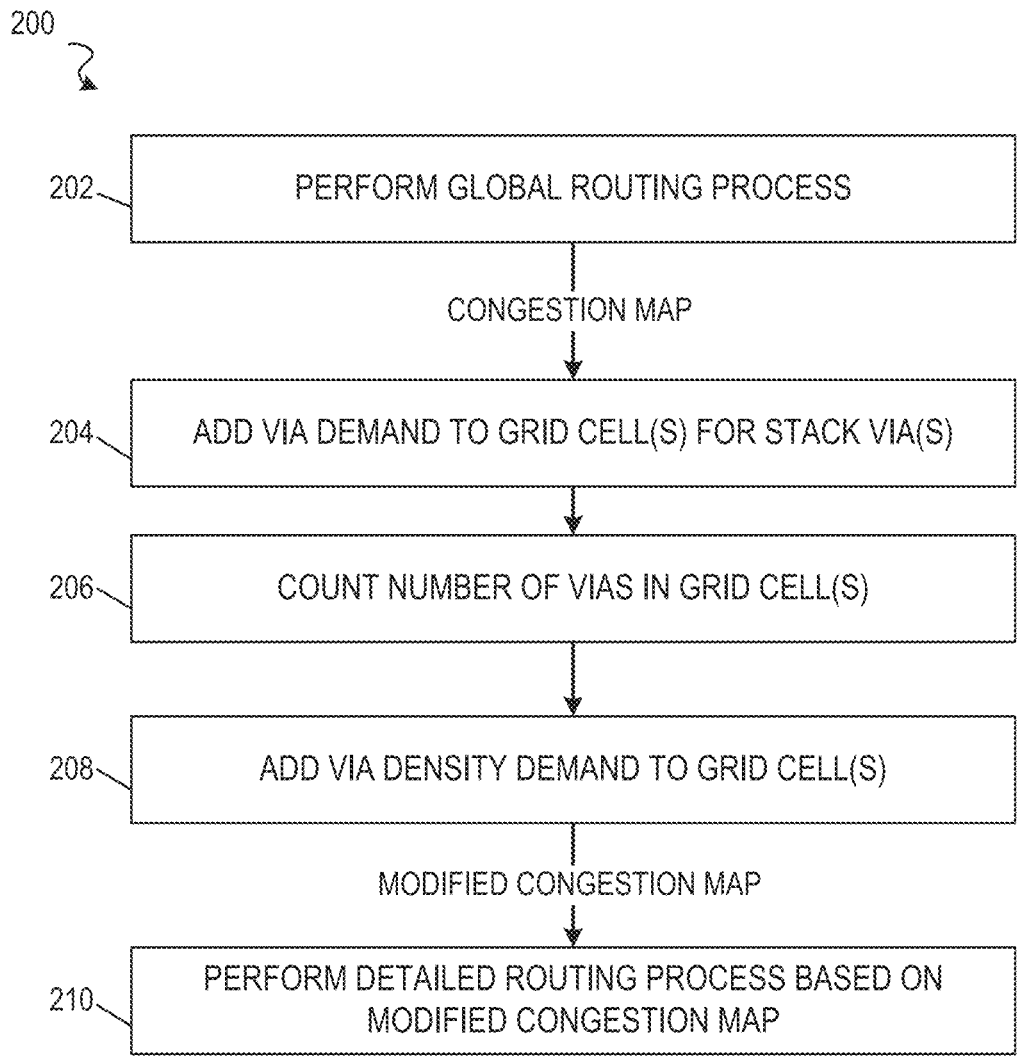
FIGS. 2 through 4 are flowcharts illustrating example methods for routing a circuit design using routing congestion based on fractional via cost, via density, or both, according to some embodiments.
Figure 3:
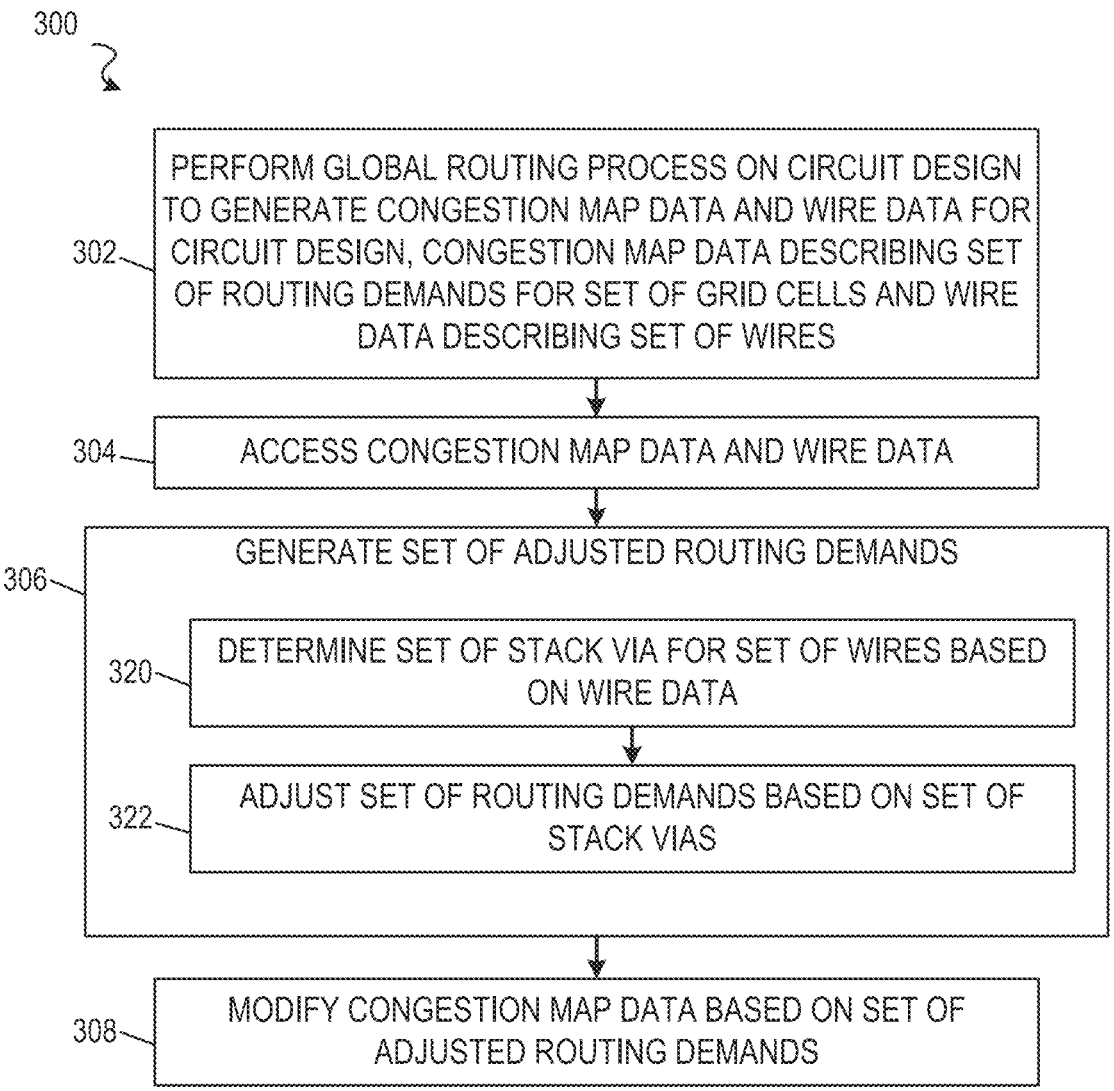
Figure 4:
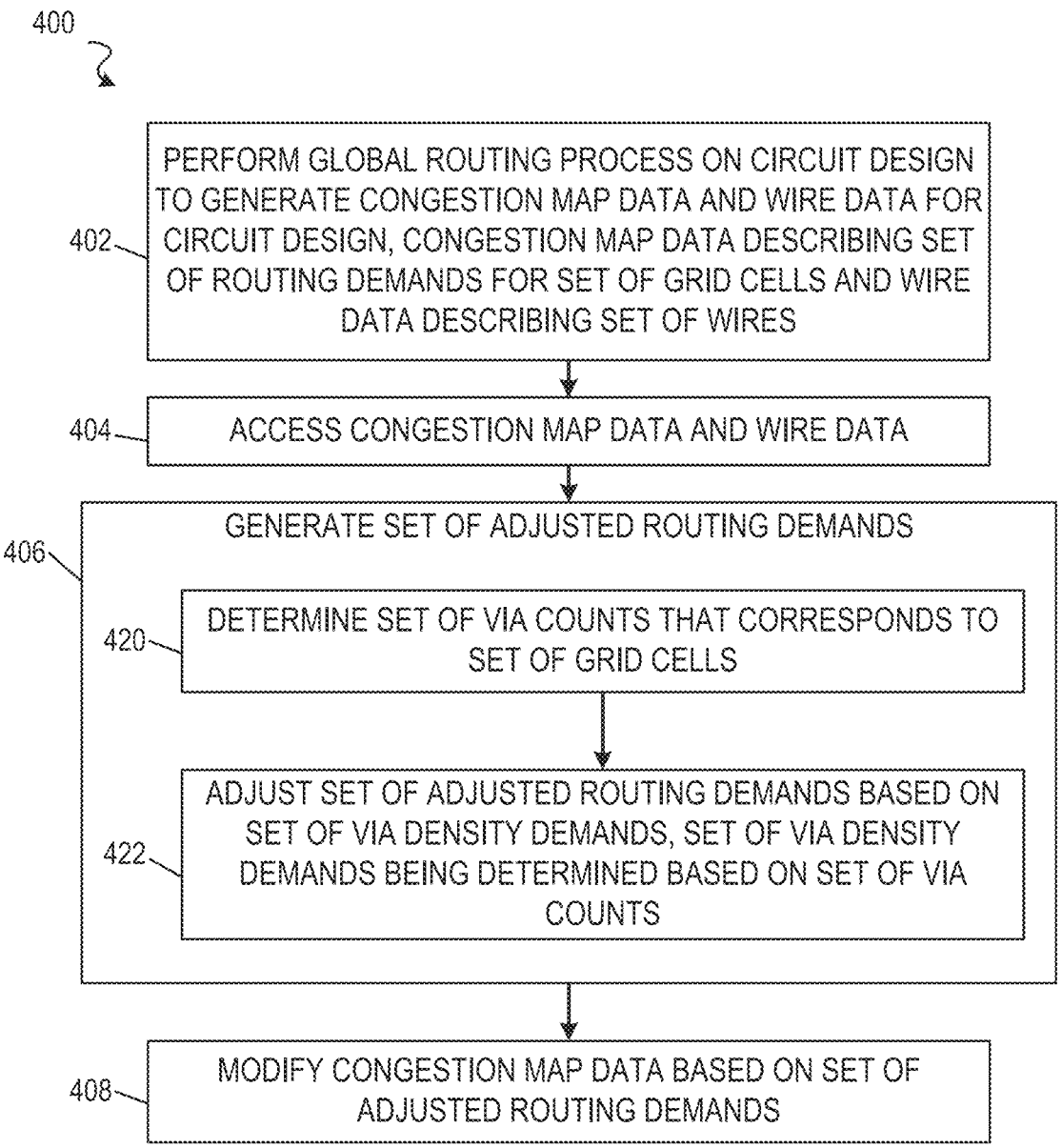

FIGS. 2 through 4 are flowcharts illustrating example methods for routing a circuit design using routing congestion based on fractional via cost, via density, or both, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For example, the operations of a method 200 of FIG. 2 can be represented by executable instructions that, when executed by a hardware processor of a computing device, cause the computing device to perform the method 200. An operation of a method described herein can be performed by a hardware processor (e.g., central processing unit or graphics processing unit) of a computing device (e.g., desktop, server, etc.), Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 2, the flowchart illustrates the example method 200 for routing a circuit design using routing congestion based on fractional via cost and via density, according to sonic embodiments. A shown, at operation 202, a global routing process is performed on a circuit design (described by circuit design data), where the global routing process generates congestion map data (describing a congestion map) and wiring (or wire) data for the circuit design. For various embodiments, the congestion map data describes routing congestion for a plurality of grid cells of the circuit design. Additionally, for various embodiments, the wiring data describes a set of wires (e.g., a list of wires) for the circuit design. After generation of the congestion map data (by operation 202), at operation 204, routing demand is adjusted based on fractional via costs by adding a via demand to one or more grid cells (described by the congestion map data) that comprise one or more stack vi as (described by the wiling data), Depending on the embodiment, operation 204 can be performed in accordance with some or all of a method 300 of FIG. 3, a method 500 of FIG. 5, or some combination thereof. As shown, operation 206 counts a number of vias in each of one or more grid cells (e.g., all grid cells described by the congestion map data). Depending on the embodiment, operation 206 can be performed in accordance with some or all of a method 600 of FIG. 6. Thereafter, operation 208 adjusts routing demand based on via density by adding a via density demand to one or more grid cells (described by the congestion map data) based on the number of vias counted by operation 206. Depending on the embodiment, operation 208 can be performed in accordance with some or all of a method 700 of FIG. 7.

The result of performing operation 204, operation 208, or both results in a modified version of the congestion map data (modified congestion map data) that describes a modified congestion map for the circuit design. For some embodiments, operation 204 results in a modified version of the congestion map data, and operation 206 is performed based on the modified version of the congestion map data generated by operation 204. The modified congestion map data represents a more accurate congestion map than otherwise possible without use of an embodiment described. herein. Based on the modified congestion map data, at operation 210, a detailed routing process (e.g., that is part of an EDA tool) is performed for the circuit design, which can result in improved detailed-routed circuit design as described herein. Additionally, based on the modified congestion map data, at operation 210, placement spreading can be performed to repair/address routing congestion.

Referring now to FIG. 3, the flowchart illustrates the example method 300 for routing a circuit design that uses routing congestion based on fractional via cost, according to some embodiments. In particular, the method 300 adjusts routing demand of one or more grid cells based on fractional via cost. At operation 302, a global routing process is performed on a circuit design (e.g., described by circuit design data) to generate congestion map data and wiring data for the circuit design, where the congestion map data describes routing congestion for a plurality of grid cells of the circuit design and where the wiring data describes a set of wires for the circuit design. For some embodiments, the plurality of grid cells (of the circuit design) comprises grid cells for one or more layers of the circuit design (e.g., where each layer has its own set of grid cells. Subsequently, at operation 304, the congestion map data and the wiring data generated by operation 302 is accessed.

Figure 5:
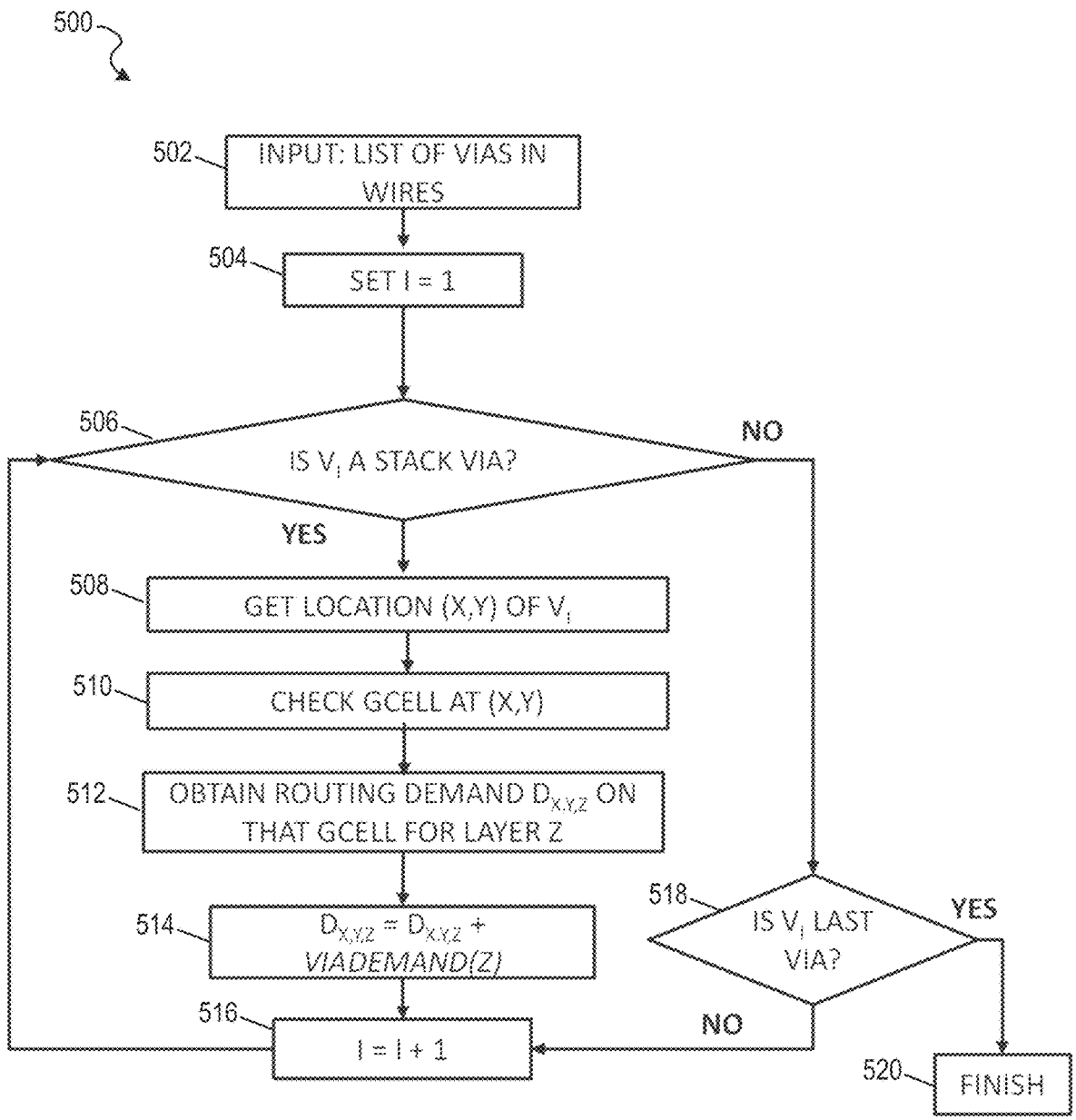
FIG. 5 is a flowchart illustrating an example method for adjusting routing demand of one or more grid cells based on fractional via cost, according to some embodiments.

Eventually, the method 300 proceeds to operation 306, where a set of adjusted routing demands is generated by performing operations 320 and 322. Operation 320 determines a set of stack vias for the set of wires based on the wiring data generated by operation 302 (and accessed by operation 304). An example of stack and non-stack vias is illustrated and described with respect to FIG. 8. Subsequently, at operation 322, the set of routing demands is adjusted based on the set of stack vias. As noted herein, the set of routing demands can be described by the congestion map data generated by operation 302 (and accessed by operation 304). For some embodiments, operation 322 comprises performing the following operations for each select stack via in the set of stack vias determined by operation 320: determining a select grid cell in the set of grid cells that corresponds to (e.g., contains) the select stack via; and adding a via demand to a demand in the set of routing demands that corresponds to the select grid cell (e.g., the via demand added to the demand of the select grid cell). For example, the via demand can be determined based on a minimum length for a via on a select layer of the circuit design (where the select layer is associated with the select demand) and based on a grid cell run length. Additionally, for some embodiments, operation 322 can also consider non-stack vias where a determined layer has a more restricted constraint or the via is taking extra tracks. The minimum length (for the via on the select layer) can be based on a spacing rule for the select layer, a minimum area for the select layer, and a wire width for the select layer. The following Formula 1 represents an example for determining (e.g., calculating) the via demand for a layer z:

$$\text{viaDemand}(z) = (\text{minViaLength}(z)/\text{GCellRunLength}) \times \text{Mul},$$

where minViaLength(z) represents a minimum length a via should have based on one or more design rules for layer z, where GCellRunLength represents a grid cell run length based on via spacing for the layer z, and where Mul represents a multiplier that can be user-defined. FIG. 5 illustrates an example of how some embodiments perform operations 320 and 322 of the method 300.

For some embodiments, after operation 306 has completed, operation 308 modifies the congestion map data based on the set of adjusted routing demands generated by operation 306. As described herein, a detailed routing process can be performed for the circuit design based on the congestion map data that results from operation 308. Alternatively, if the method 300 is executed as part of a pre-routing process, a congestion repair from placement can be performed to spread regions with high routing congestion. According to some embodiments, prior to proceeding with operation 308, the set of routing demands is further adjusted based on via density, which can be performed in accordance with operation 406 of a method 400 described with respect to FIG. 4.

Referring now to FIG. 4, the flowchart illustrates the example method 400 for routing a circuit design that uses routing congestion based on via density, according to some embodiments. In particular, the method 400 adjusts routing demand of one or more grid cells based on via density. As shown, the method 400 comprises operations 402 and 404, which according to some embodiments, are respectively similar to operations 302 and 304 described with respect to the method 300 of FIG. 3.

Figure 6:
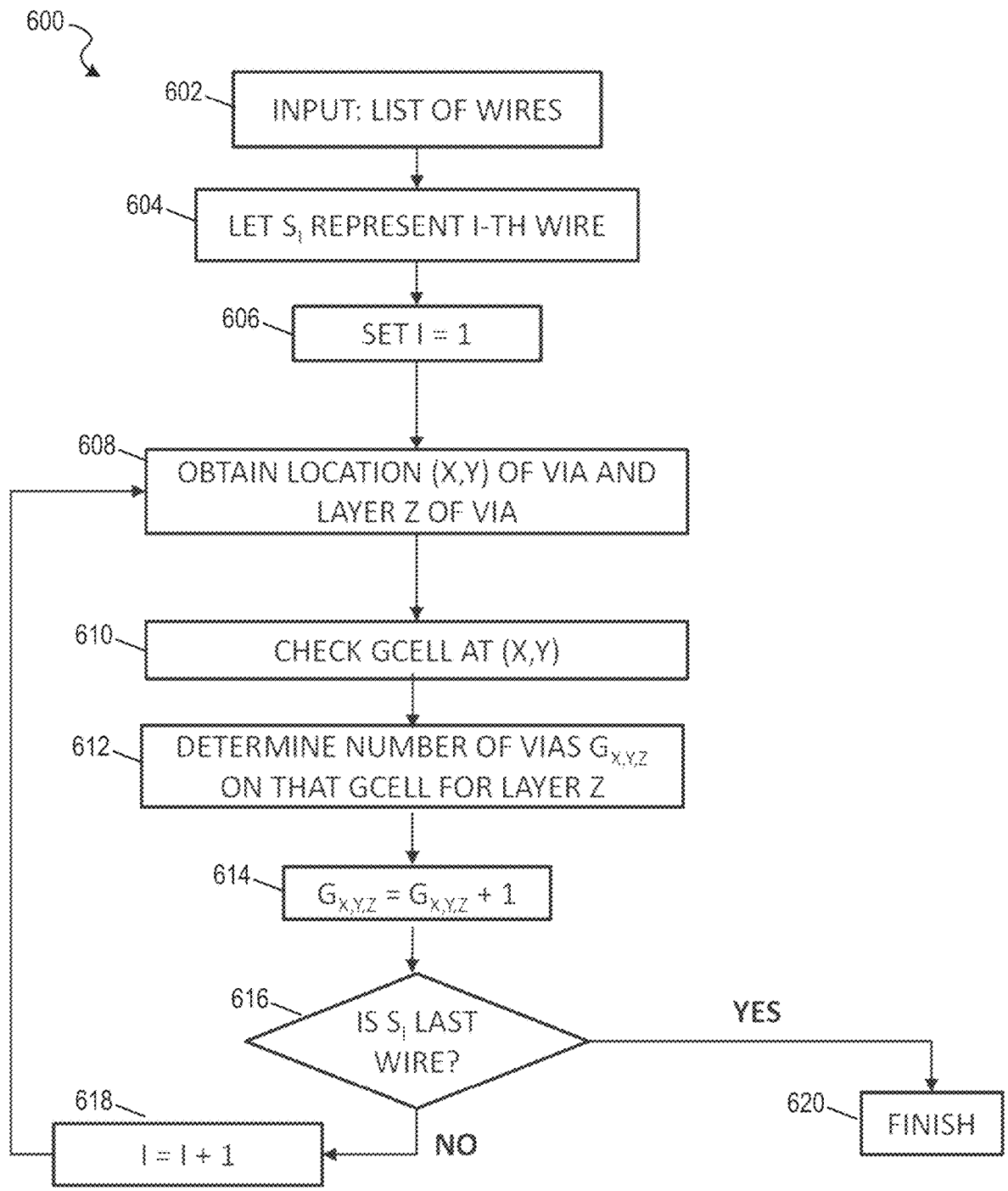
FIG. 6 is a diagram illustrating an example of a method for determining a set of via counts for one or more grid cells, according to some embodiments.

Eventually, the method 400 proceeds to operation 406, where a set of adjusted routing demands is generated by performing operations 420 and 422. Operation 420 determines (e.g., calculates) a set of via counts that corresponds to the set of grid cells by determining a count of vias in each grid cell of the set of grid cells based on the wiring data generated by operation 402 (and accessed by operation 404). For various embodiments, the set of via counts includes counts for both stack vias and non-stack vias contained by the set of grid cells. FIG. 6 illustrates an example of how some embodiments perform operation 420 of the method 400. Subsequently, operation 422 adjusts the set of routing demands based on the set of via counts determined by operation 420. As noted herein, the set of routing demands can be described by the congestion map data generated by operation 402 (and accessed by operation 404). For some embodiments, operation 422 comprises, for each select grid cell in the set of grid cells described by the congestion map data, adding a via density demand to a select demand in the set of routing demands that corresponds to the select grid cell. According to some embodiments, the via density demand is determined (e.g., calculated) based on the select demand and a select via count in the set of via counts (determined by operation 422) that correspond to (e.g., associated with) the select grid cell. Depending on the embodiment, the density demand can be equal to an extra demand multiplied by the select via count, where the extra demand can be determined based on a demand for a cut space rule on a select layer of the circuit design associated with the select demand.

For some embodiments, after operation 406 has completed, operation 408 modifies the congestion map data based on the set of adjusted routing demands generated by operation 406. As described herein, a detailed routing process (or a congestion repair process) can be performed for the circuit design based on the congestion map data that results from operation 408.

FIG. 5 is a flowchart illustrating example method 500 for adjusting routing demand of one or more grid cells based on fractional via cost, according to some embodiments. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. For some embodiments, the method 500 represents an example of performing operation 204 of the method 200 of FIG. 2.

Referring now to FIG. 5, operation 502 receives as input a list of vias in the wires of a circuit design, which can be described by wiring data for the circuit design. To initialize the method 500, operation 504 sets a current element number i to 1. Operation 506 determines whether an i-th via Vi in the list of vias is a stack via. If yes, the method 500 proceeds to operation 508, otherwise the method 500 proceeds to operation 518.

At operation 508, a coordinate location (represented by X, Y) of the i-th Vi is obtained. Based on this coordinate location, operation 510 checks (e.g., determines or identifies) a current grid cell GCELL corresponding to the coordinate location of the i-th via Vi. Then, operation 512 obtains the routing demand $D_{X,Y,Z}$ for the current grid cell GCELL on a layer Z of the circuit design (e.g., obtained from the congestion map data for the circuit design). At operation 514, the routing demand $D_{X,Y,Z}$ is adjusted by adding, to the routing demand $D_{X,Y,Z}$ a via demand (represented by viaDemand(Z)) on the layer Z of the circuit design. Thereafter, the method 500 proceeds to operation 516.

For some embodiments, a via demand viaDemand(Z) for a layer Z is determined (e.g., calculated) by the following Formula 1:

$$viaDemand(Z) = \left(\frac{minViaLength(Z)}{GCellRunLength}\right) \times Mul,$$

where minViaLength(z) represents a minimum length a. via should have based on one or more design rules for layer Z of a circuit design, GCellRunLength represents a run length of a grid cell of the circuit design, and Mul represents a multiplier, which may or may not be user-defined value.

For some embodiments, a minimum length a via should have based on one or more design rules for layer Z of a circuit design is determined (e.g., calculated) by the following Formula 2:

$$minViaLength(Z) = \left(\frac{MinArea(Z)}{WireWidth(Z)}\right) + 2 \times viaSpace(Z),$$

wherein MinArea(Z) a minimum area for layer Z of a circuit design, WireWidth(Z) represents a minimum width for a wire for the layer Z, and viaSpace(Z) represents a spacing rule for a via on the layer Z (e.g., end-of-line spacing). For some embodiments, a spacing rule for a via on the layer Z is determined (e.g., calculated) by the following Formula 3:

$$viaSpace(Z) = MAX\left(\frac{wireSpace(Z)}{ruleBasedSpacing(Z)}\right),$$

wherein wireSpace(Z) is a minimum wire space for layer Z of a circuit design, and ruleBasedSpacing(Z) represents a spacing rule for the layer Z (e.g., end-of-line spacing).

Eventually, operation 518 determines whether the i-th Vi is the last via in the list of vias. If yes, the method 500 ends at operation 520, otherwise the method 500 proceeds to operation 516. At operation 516, the current element number i is incremented by one, and the method 500 returns to operation 506, where operation 506 can be performed again with respect to the next via in the list of vias (if it exists).

FIG. 6 is a flowchart illustrating example method 600 for determining a set of via counts for one or more grid cells, according to some embodiments. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. For some embodiments, the method 600 represents an example of performing operation 206 of the method 200 of FIG. 2.

Referring now to FIG. 6, operation 602 receives as input a list of wires of a circuit design, which can be described by wiring data for the circuit design. To initialize the method 600, operation 604 lets Si represent an i-th wire in the list of wires, and operation 606 sets a current element number i to 1. Afterwards, operation 608 obtains a coordinate location (represented by X, Y) of a via of the i-th wire Si and a layer Z of the via. Based on this coordinate location, operation 610 checks (e.g., determines or identifies) a current grid cell GCELL corresponding to the coordinate location of the via. Then, operation 612 lets variable $G_{X,Y,Z}$ be the number of vias in the current grid cell GCELL for layer Z. Thereafter, operation 614 increments $G_{X,Y,Z}$ by one. Operation 616 determines whether Si is the last in the list of wires. If yes, the method 600 proceeds to operation 620 where the method 600 ends; otherwise, the method 600 proceeds to operation 618, where the current element number i is incremented by one and the method 600 returns to operation 608.

Figure 7:
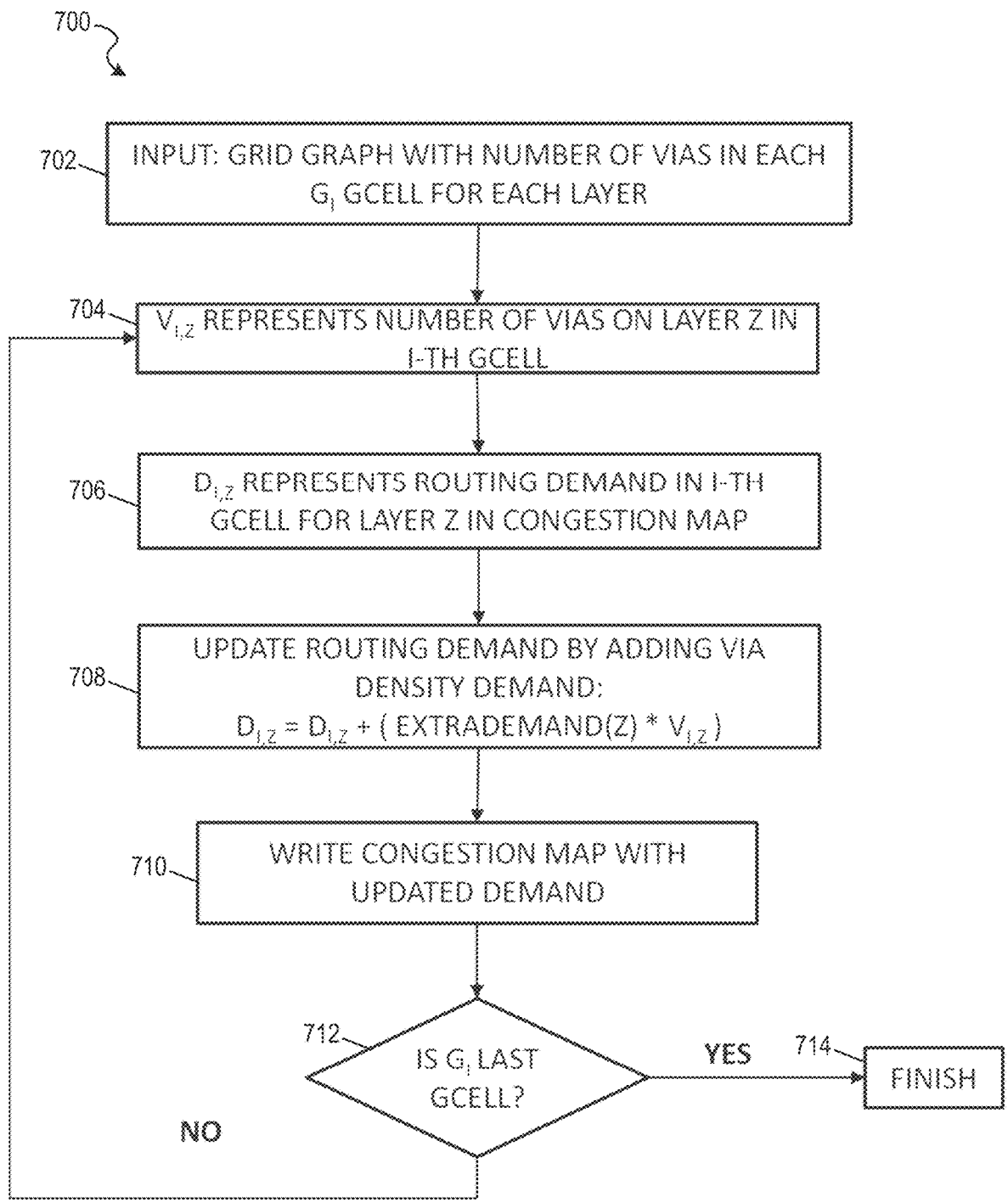
FIG. 7 is a flowchart illustrating an example method for adjusting routing demand of one or more grid cells based on via density, according to some embodiments.

FIG. 7 is a flowchart illustrating example method 700 for adjusting routing demand of one or more grid cells based on via density, according to some embodiments. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. For some embodiments, the method 700 represents an example of performing operation 208 of the method 200 of FIG. 2.

Referring now to FIG. 7, operation 702 receives a grid graph of a circuit design with a number of vias in each Gi grid cell for each layer. The method 700 proceeds to operation 704, where operation 704 causes $V_{I,Z}$ to represent the number of vias on layer Z in the i-th grid cell Gi. The method 700 then proceeds to operation 706, where operation 706 causes $D_{I,Z}$ to represent routing demand in the i-th grid cell Gi for layer Z in congestion map. Operation 708 then updates routing demand by adding via density demand to $D_{I,Z}$ by the following Formula 4:

$$D_{I,Z} = D_{I,Z} + extraDemand(Z) \times V_{I,Z},$$

where extraDemand(Z) represents an extra routing demand for layer Z of a circuit design, and $V_{I,Z}$ represents the number of vias determined by operation 704. For some embodiments, the extra routing demand for layer Z of a circuit design is determined (e.g., calculated) by the following Formula 5:

$$extraDemand(Z) = \frac{(viaDemand(Z) + cutSpacingDemand(Z))}{pitch(Z) \times Factor},$$

where viaDemand(Z) represents a via demand on layer Z of a circuit design, cutSpacingDemand(Z) represents a routing demand required by cut spacing rules for layer Z of the circuit design, pitch(Z) represents pitch (spacing) between each track, and Factor represents a multiplier, which may or may not be a user-defined value.

Eventually, operation 710 writes congestion map (congestion map data) with routing demand as updated by operation 708. Operation 712 determines whether the i-th grid cell Gi is the last grid cell in the grid graph. If yes, the method 700 proceeds to operation 714 where the method 700 ends; otherwise, the method 700 returns to operation 704 to perform operation 704 for the next grid cell in the grid graph.

Figure 8:
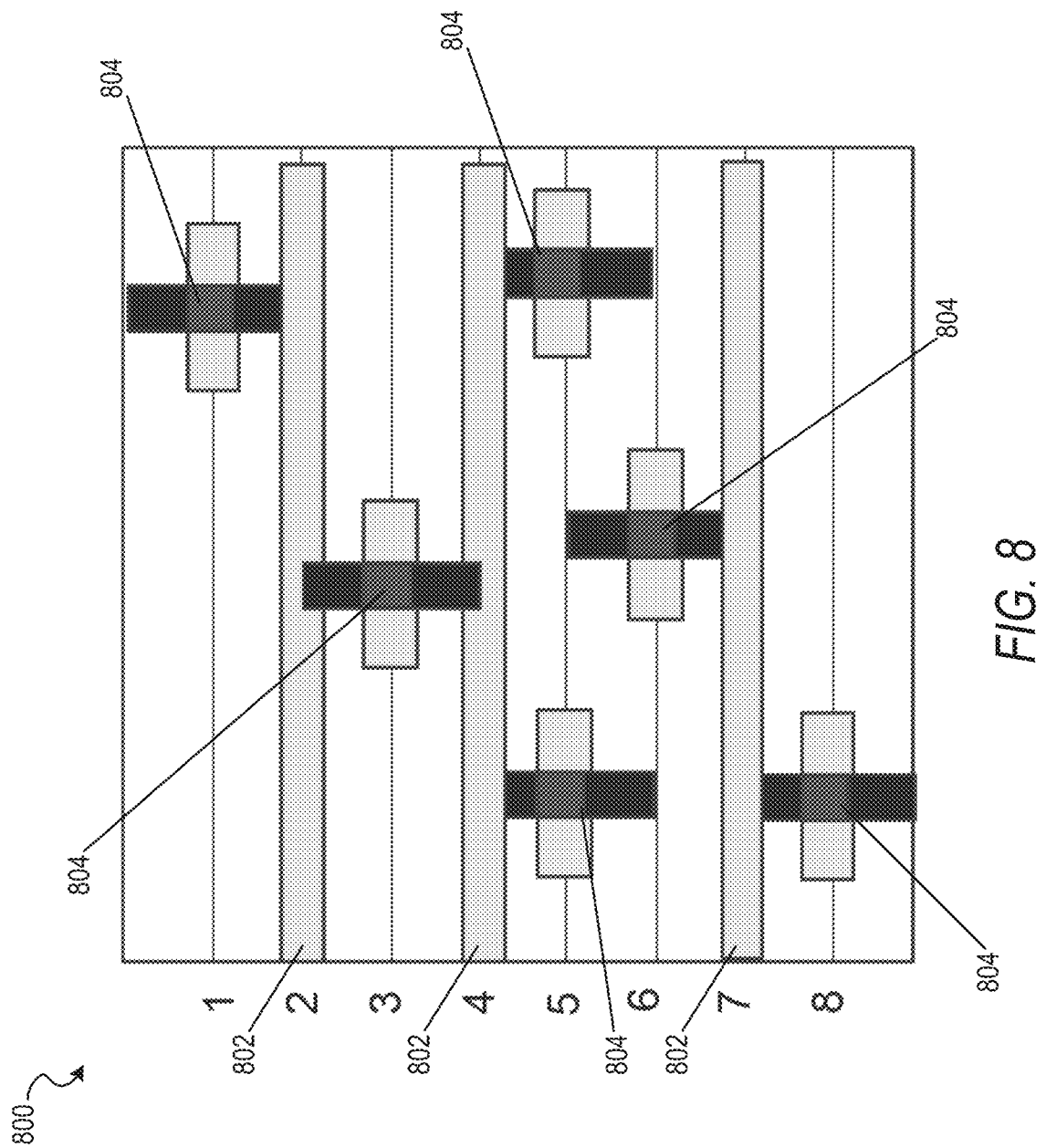
FIG. 8 is a diagram illustrating example vias on which a method for routing congestion based on fractional via cost can be performed, according to some embodiments.

FIG. 8 is a diagram illustrating example vias on which a method for routing congestion based on fractional via cost can be performed, according to some embodiments. In particular, FIG. 8 presents a grid cell 800 with eight tracks. As shown, the grid cell 800 has three wires 802 and six stack vias 804. An embodiment described herein can determine a routing demand of six for the grid cell 800, where the three wires 802 would result in a routing demand of three, and the six stack vias 804 would result in a routing demand of three based on each stack via taking 50% of track demand (as opposed to 100%).

Figure 9:
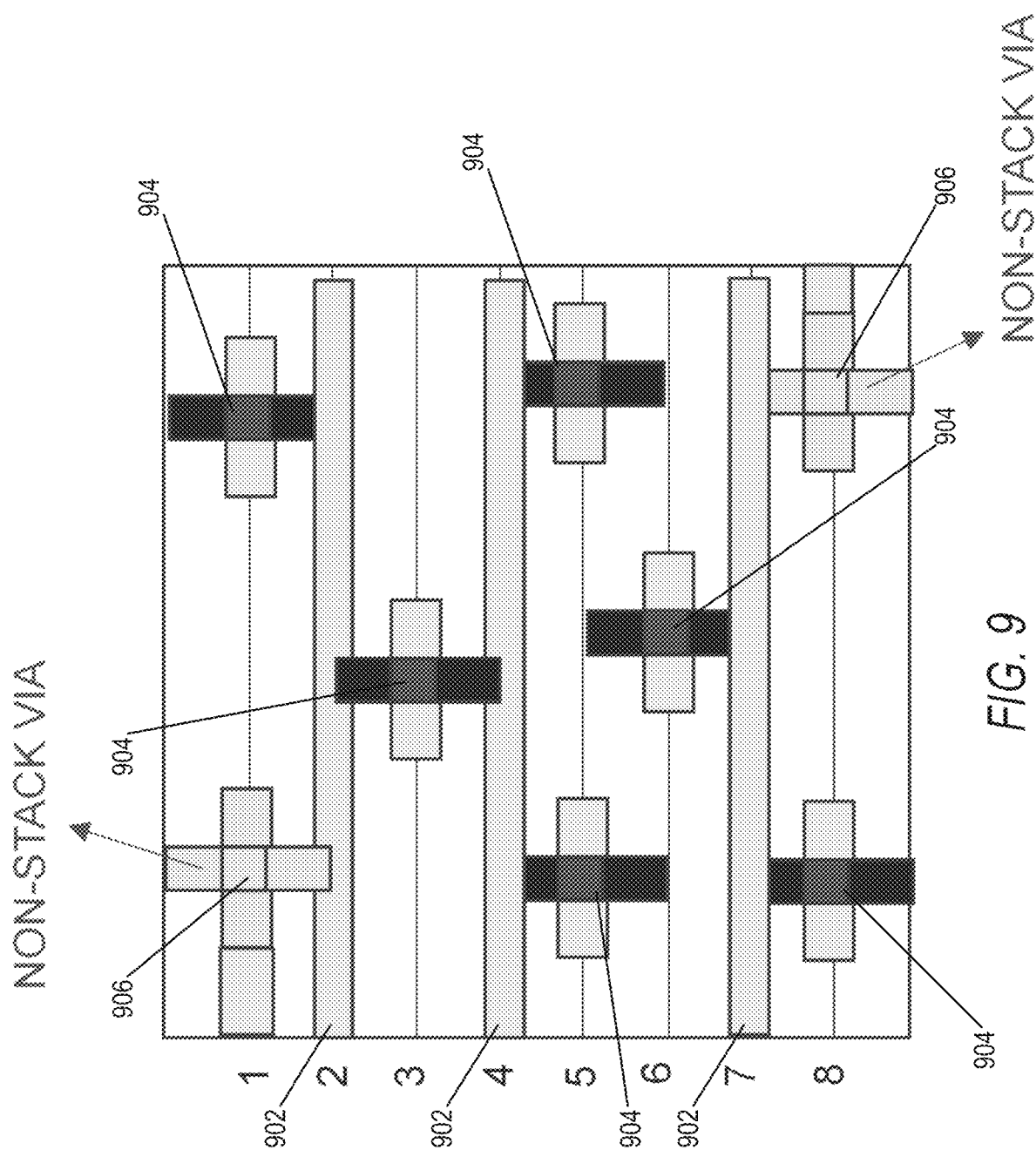
FIG. 9 is a flowchart illustrating example vias on which a method for routing congestion based on fractional via cost and via density can be performed, according to some embodiments.

FIG. 9 is a diagram illustrating example vias on which a method for routing congestion based on fractional via cost and via density can be performed, according to some embodiments. Like FIG. 8, FIG. 9 presents a grid cell 900 with eight tracks. As shown, the grid cell 900 has three wires 902, six stack vias 904, and two non-stack vias 906. An embodiment described herein can determine a routing demand of eight, where the three wires 902 would result in a routing demand of three, the six stack vias 904 would result in a routing demand of three based on each stack via taking 50% of track demand (as opposed to 100%), and a via density of the eight vias (six stack vias 904 and two non-stack vias 906) would result in an extra routing demand of two (based on eight vias with 0.25 as cost).

Figure 10:
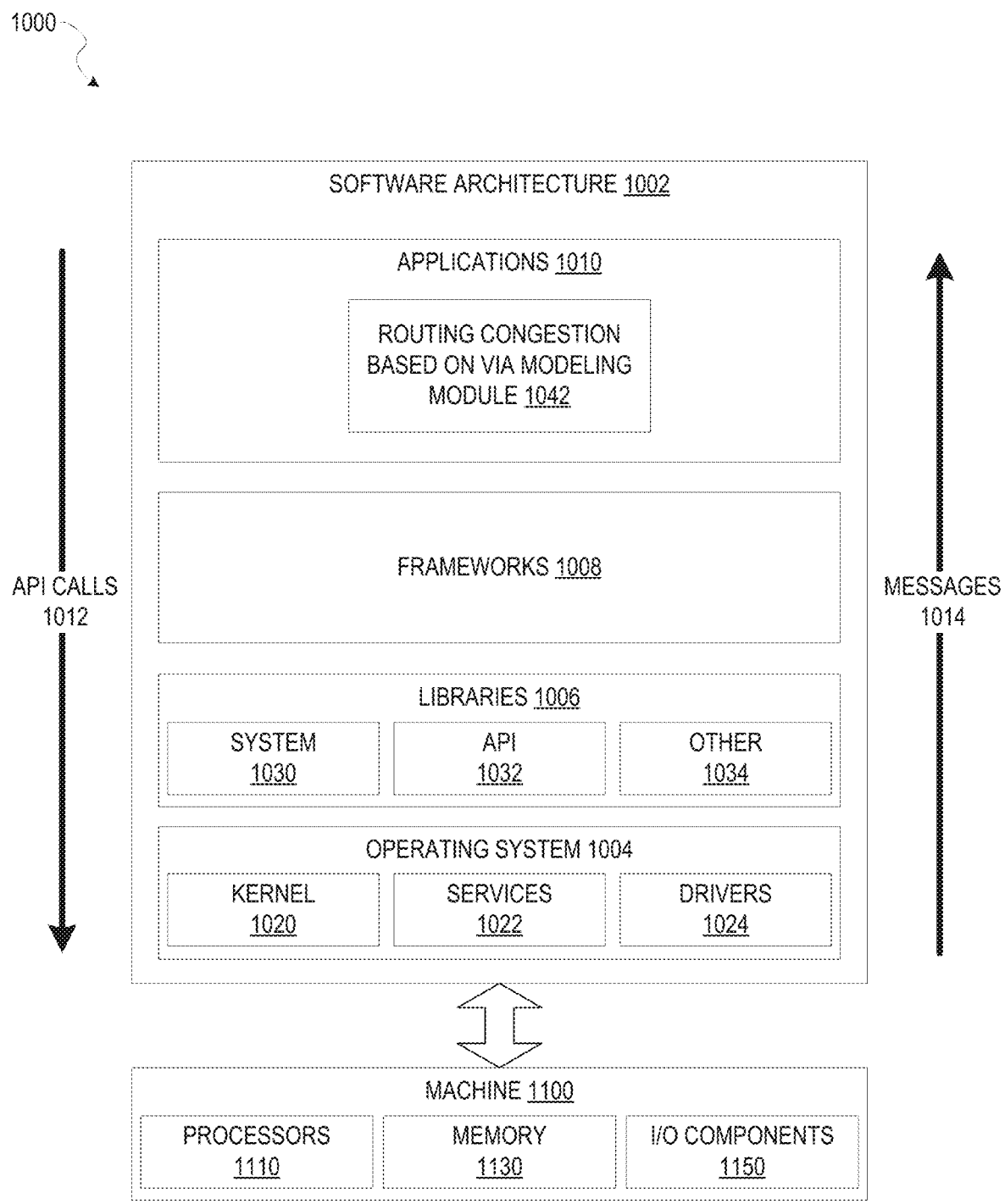
FIG. 10 is a block diagram illustrating an example of a software architecture that may be operating on an EDA computing device and may be used with methods for routing congestion based on fractional via cost, via density, or both, according to some embodiments.

FIG. 10 is a block diagram 1000 illustrating an example of a software architecture 1002 that may be operating on an FDA computer and may be used with methods for routing congestion based on fractional via cost, via density, or both, according to some example embodiments. The software architecture 1002 can be used as an EDA computing device to implement any of the methods described above. Aspects of the software architecture 1002 may, in various embodiments, be used to store circuit designs, and to route a circuit design based on adjusting a routing demand in an EDA environment to generate circuit designs, from which physical devices may be generated.

FIG. 10 is merely a non-limiting example of a software architecture 1002, and it will be appreciated that many other architectures can be implemented to facilitate the functionality described herein. In various embodiments, the software architecture 1002 is implemented by hardware such as a machine 1100 of FIG. 11 that includes processors 1110, memory 1130, and input/output (I/O) components 1150. In this example, the software architecture 1002 can be conceptualized as a stack of layers where each layer may provide a particular functionality. For example, the software architecture 1002 includes layers such as an operating system 1004, libraries 1006, software frameworks 1008, and applications 1010. Operationally, the applications 1010 invoke application programming interface (API) calls 1012 through the software stack and receive messages 1014 in response to the API calls 1012, consistent with some embodiments. In various embodiments, any client device, any server computer of a server system, or any other device described herein may operate using elements of the software architecture 1002. An EDA computing device described herein may additionally be implemented using aspects of the software architecture 1002, with the software architecture 1002 adapted for operating to perform routing a net of a circuit design in any manner described herein.

In one embodiment, an EDA application of the applications 1010 performs circuit design routing using routing congestion on fractional via cost, via density, or both, according to embodiments described herein using various modules within the software architecture 1002. For example, in one embodiment, an EDA computing device similar to the machine 1100 includes the memory 1130 and the one or more processors 1110. The processors 1110 also implement a routing congestion based on via modeling module 1042, which can adjust a routing demand of a grid cell of a circuit design based on fractional via cost, via density, or both, in accordance with various embodiments described herein.

In various other embodiments, rather than being implemented as modules of the one or more applications 1010, the routing congestion based on via modeling module 1042 may be implemented using elements of the libraries 1006, the operating system 1004, or the software frameworks 1008.

In various implementations, the operating system 1004 manages hardware resources and provides common services. The operating system 1004 includes, for example, a kernel 1020, services 1022, and drivers 1024. The kernel 1020 acts as an abstraction layer between the hardware and the other software layers, consistent with some embodiments. For example, the kernel 1020 provides memory management, processor management (e.g., scheduling), component management, networking, and security settings, among other functionalities. The services 1022 can provide other common services for the other software layers. The drivers 1024 are responsible for controlling or interfacing with the underlying hardware, according to some embodiments. For instance, the drivers 1024 can include display drivers, signal-processing drivers to optimize modeling computation, memory drivers, serial communication drivers (e.g., Universal Serial Bus (USB) drivers), Wi-Di® drivers, audio drivers, power management drivers, and so forth.

In some embodiments, the libraries 1006 provide a low-level common infrastructure utilized by the applications 1010. The libraries 1006 can include system libraries 1030 such as libraries of blocks for use in an EDA environment or other libraries that can provide functions such as memory allocation functions, string manipulation functions, mathematic functions, and the like. In addition, the libraries 1006 can include API libraries 1032 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 1006 may also include other libraries 1034.

The software frameworks 1008 provide a high-level common infrastructure that can be utilized by the applications 1010, according to some embodiments. For example, the software frameworks 1008 provide various graphic user interface (GUI) functions, high-level resource management, high-level location services, and so forth. The software frameworks 1008 can provide a broad spectrum of other APIs that can be utilized by the applications 1010, some of which may be specific to a particular operating system 1004 or platform. In various embodiments, the systems, methods, devices, and instructions described herein may use various files, macros, libraries, and other elements of an EDA design environment to implement routing congestion based on fractional via cost, via density, or both as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 1002, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) are configured by software (e.g.; an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity; be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. The methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines 1100 including processors 1110), with these operations being accessible via a network (e.g., the Internet) and via one or more appropriate interfaces (e.g., an API). In certain embodiments, for example, a client device may relay or operate in communication with cloud computing systems and may access circuit design information in a cloud environment. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations. As used herein, "processor-implemented module" refers to a hardware module implemented using one or more processors.

The performance of certain of the operations may be distributed among the processors, not only residing within a single machine 1100, but deployed across a number of machines 1100. In some example embodiments, the processors 1110 or processor-implemented modules are located in a single geographic location (e.g., within a home environment, an office environment, or a server farm). In other example embodiments, the processors or processor-implemented modules are distributed across a number of geographic locations.

Figure 11:
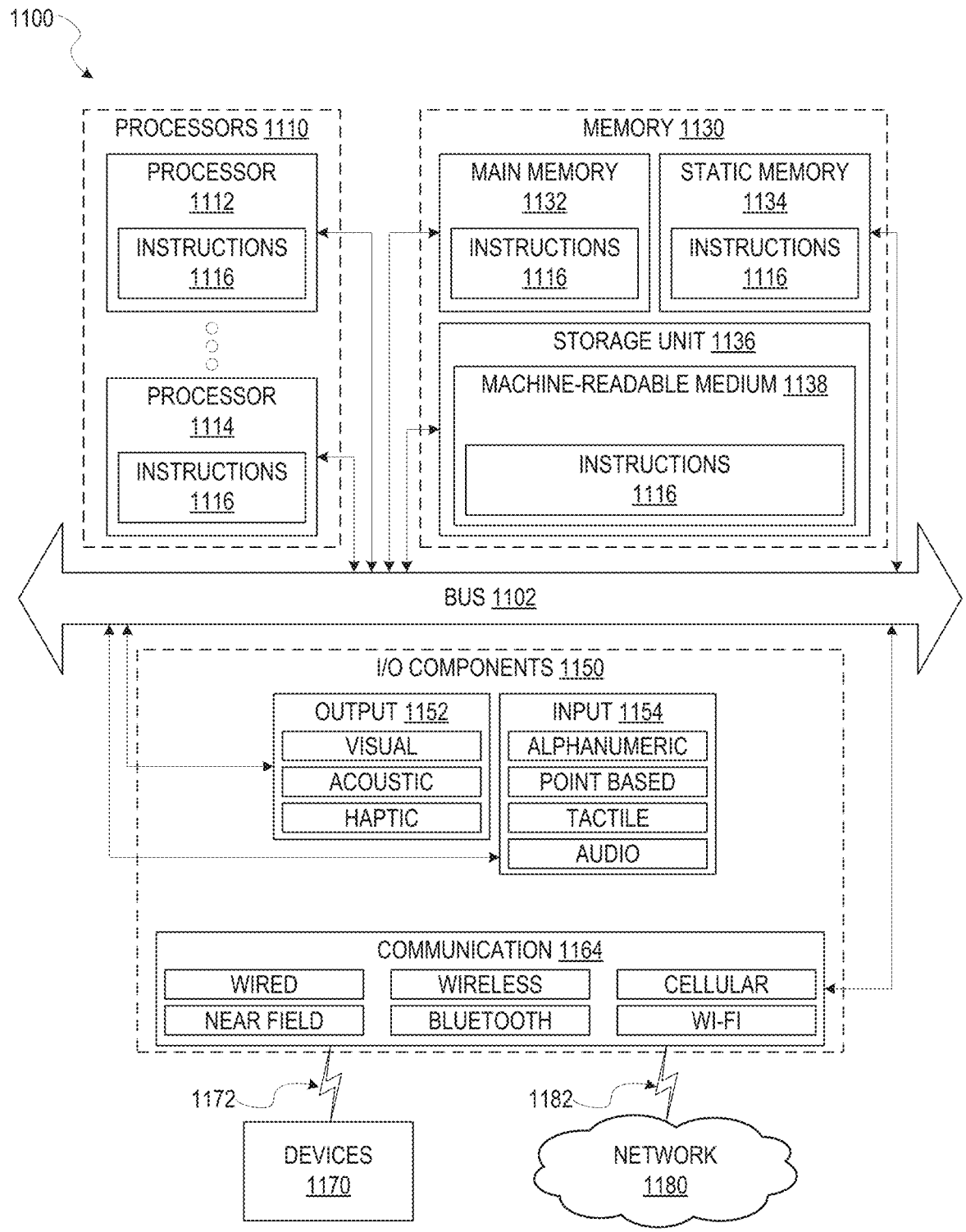
FIG. 11 is a diagram representing a machine in the form of a computer system within which a set of instructions are executed, causing the machine to perform any one or more of the methods discussed herein, according to some embodiments.

FIG. 11 is a diagrammatic representation of the machine 1100 in the form of a computer system within which a set of instructions may be executed for causing the machine 1100 to perform any one or more of the methodologies discussed herein, according to an example embodiment. FIG. 11 shows components of the machine 1100, which is, according to some embodiments, able to read instructions from a machine-readable medium (e.g., a machine-readable storage medium) and perform any one or more of the methodologies discussed herein. Specifically, FIG. 11 shows a diagrammatic representation of the machine 1100 in the example form of a computer system, within which instructions 1116 (e.g., software, a program, an application, an applet, an app, or other executable code) for causing the machine 1100 to perform any one or more of the methodologies discussed herein can be executed. In alternative embodiments, the machine 1100 operates as a standalone device or can be coupled (e.g., networked) to other machines. In a networked deployment, the machine 1100 may operate in the capacity of a server machine or a client machine in a server-client network environment, or as a peer machine in a peer-to-peer (or distributed) network environment. The machine 1100 can comprise, but not be limited to, a server computer, a client computer, a personal computer (PC), a tablet computer, a laptop computer, a netbook, or any machine capable of executing the instructions 1116, sequentially or otherwise, that specify actions to be taken by the machine 1100. Further, while only a single machine 1100 is illustrated, the term "machine" shall also be taken to include a collection of machines 1100 that individually or jointly execute the instructions 1116 to perform any one or more of the methodologies discussed herein.

In various embodiments, the machine 1100 comprises processors 1110, memory 1130, and I/O components 1150, which can be configured to communicate with each other via a bus 1102, In an example embodiment, the processors 1110 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 1112 and a processor 1114 that may execute the instructions 1116. The term "processor" is intended to include multi-core processors 1110 that may comprise two or more independent processors 1112, 1114 (also referred to as "cores") that can execute the instructions 1116 contemporaneously. Although FIG. 11 shows multiple processors 1110, the machine 1100 may include a single processor 1112 with a single core, a single processor 1112 with multiple cores (e.g., a multi-core processor 1112), multiple processors 1110 with a single core, multiple processors 1110 with multiple cores, or any combination thereof.

The memory 1130 comprises a main memory 1132, a static memory 1134, and a storage unit 1136 accessible to the processors 1110 via the bus 1102, according to some embodiments. The storage unit 1136 can include a machine-readable medium 1138 on which are stored the instructions 1116 embodying any one or more of the methodologies or functions described herein. The instructions 1116 can also reside, completely or at least partially, within the main memory 1132, within the static memory 1134, within at least one of the processors 1110 (e.g., within the processor's cache memory), or any suitable combination thereof, during execution thereof by the machine 1100. Accordingly, in various embodiments, the main memory 1132, the static memory 1134, and the processors 1110 are considered machine-readable media 1138.

As used herein, the term "memory" refers to a machine-readable medium 1138 able to store data temporarily or permanently and may be taken to include, but not be limited to, random-access memory (RAM), read-only memory (ROM), buffer memory, flash memory, and cache memory. While the machine-readable medium 1138 is shown, in an example embodiment, to be a single medium, the term "machine-readable medium" should be taken to include a single medium or multiple media (e.g., a centralized or distributed database, or associated caches and servers) able to store the instructions 1116. The term "machine-readable medium" shall also be taken to include any medium, or combination of multiple media, that is capable of storing instructions (e.g., the instructions 1116) for execution by a machine (e.g., the machine 1100), such that the instructions, when executed by one or more processors of the machine (e.g., the processors 1110), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1150 include a wide variety of components to receive input, provide output, produce output, transmit information, exchange information, capture measurements, and so on. In general, it will be appreciated that the I/O components 1150 can include many other components that are not shown in FIG. 11. The I/O components 1150 are grouped according to functionality merely for simplifying the following discussion, and the grouping is in no way limiting. In various example embodiments, the I/O components 1150 include output components 1152 and input components 1154. The output components 1152 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1154 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1150 may include communication components 1164 operable to couple the machine 1100 to a network 1180 or devices 1170 via a coupling 1182 and a coupling 1172, respectively. For example, the communication components 1164 include a network interface component or another suitable device to interface with the network 1180. In further examples, the communication components 1164 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1170 may be another machine or any of a wide variety of peripheral devices (e.g., a peripheral device coupled via a USB).

In various example embodiments, one or more portions of the network 1180 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1180 or a portion of the network 1180 may include a wireless or cellular network, and the coupling 1182 may be a Code Division Multiple Access (CDMA) connection, a Global System for Mobile communications (GSM) connection, or another type of cellular or wireless coupling.

Furthermore, the machine-readable medium 1138 is non-transitory (in other words, not having any transitory signals) in that it does not embody a propagating signal. However, labeling the machine-readable medium 1138 "non-transitory" should not be construed to mean that the machine-readable medium 1138 is incapable of movement; the machine-readable medium 1138 should be considered as being transportable from one physical location to another. Additionally, since the machine-readable medium 1138 is tangible, the machine-readable medium 1138 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components, These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A non-transitory computer-readable medium comprising instructions that, when executed by a hardware processor of a device, cause the device to perform operations comprising:

performing a global routing process on a circuit design to generate congestion map data and wiring data for the circuit design, the congestion map data describing a set of routing demands for a set of grid cells of the circuit design, the wiring data describing a set of wires for the circuit design;

generating a set of adjusted routing demands, the generating comprising:

determining a set of stack vias for the set of wires based on the wiring data; and adjusting the set of routing demands based on the set of stack vias;

modifying the congestion map data based on the set of adjusted routing demands; and performing a detailed routing process on the circuit design based on the congestion map data.

2. The non-transitory computer-readable medium of claim 1, wherein the adjusting of the set of routing demands based on the set of stack vias comprises:
for each select stack via in the set of stack vias:
determining a select grid cell in the set of grid cells that corresponds to the select stack via; and
adding a via demand to a select demand in the set of routing demands that corresponds to the select grid cell.

3. The non-transitory computer-readable medium of claim 2, wherein the via demand is based on a minimum length for a via on a select layer of the circuit design and based on a grid cell run length, the select layer being associated with the select demand.

4. The non-transitory computer-readable medium of claim 3, wherein the minimum length for the via on the select layer is based on a spacing rule for the select layer, a minimum area for the select layer, and a wire width for the select layer.

5. The non-transitory computer-readable medium of claim 1, wherein the generating comprises:
determining a set of via counts that corresponds to the set of grid cells by determining a count of vias in each grid cell of the set of grid cells based on the wiring data; and
adjusting the set of adjusted routing demands based on a set of via density demands, the set of via density demands being determined based on the set of via counts.

6. The non-transitory computer-readable medium of claim 5, wherein the set of via counts includes a count of stack vias and a count of non-stack vias.

7. The non-transitory computer-readable medium of claim 5, wherein the adjusting of the set of routing demands based on the set of via density demands comprises:
for each select grid cell in the set of grid cells, adding a via density demand to a select demand in the set of routing demands that corresponds to the select grid cell, the via density demand being determined based on the select demand and a select via count in the set of via counts that corresponds to the select grid cell.

8. The non-transitory computer-readable medium of claim 7, wherein the via density demand is equal to an extra demand multiplied by the select via count.

9. The non-transitory computer-readable medium of claim 8, wherein the extra demand is based on a demand for a cut space rule on a select layer of the circuit design, the select layer being associated with the select demand.

10. The non-transitory computer-readable medium of claim 1, wherein the set of grid cells comprises grid cells for a plurality of layers of the circuit design.

11. A method comprising:
performing, by a hardware processor, a global routing process on a circuit design to generate congestion map data and wiring data for the circuit design, the congestion map data describing a set of routing demands for a set of grid cells of the circuit design, the wiring data describing a set of wires for the circuit design;
generating, by the hardware processor, a set of adjusted routing demands, the generating comprising:
determining a set of via counts that corresponds to the set of grid cells by determining a count of vias in each grid cell of the set of grid cells based on the wiring data; and
adjusting the set of adjusted routing demands based on a set of via density demands, the set of via density demands being determined based on the set of via counts;
modifying, by the hardware processor, the congestion map data based on the set of adjusted routing demands; and
performing, by the hardware processor, a detailed routing process on the circuit design based on the congestion map data.

12. The method of claim 11, wherein the adjusting of the set of routing demands based on the set of via density demands comprises:
for each select grid cell in the set of grid cells, adding a via density demand to a select demand in the set of routing demands that corresponds to the select grid cell, the via density demand being determined based on the select demand and a select via count in the set of via counts that corresponds to the select grid cell.

13. The method of claim 12, wherein the via density demand is equal to an extra demand multiplied by the select via count.

14. The method of claim 13, wherein the extra demand is based on a demand for a cut space rule on a select layer of the circuit design, the select layer being associated with the select demand.

15. The method of claim 11, wherein the generating comprises:
determining a set of stack vias for the set of wires based on the wiring data; and
adjusting the set of routing demands based on the set of stack vias.

16. The method of claim 15, wherein the adjusting of the set of routing demands based on the set of stack vias comprises:
for each select stack via in the set of stack vias:
determining a select grid cell in the set of grid cells that corresponds to the select stack via; and
adding a via demand to a select demand in the set of routing demands that corresponds to the select grid cell.

17. The method of claim 16, wherein the via demand is based on a minimum length for a via on a select layer of the circuit design and based on a grid cell run length, the select layer being associated with the select demand.

18. The method of claim 17, wherein the minimum length for the via on the select layer is based on a spacing rule for the select layer, a minimum area for the select layer, and a wire width for the select layer.

19. The method of claim 11, wherein the set of via counts includes a count of stack vias and a count of non-stack vias.

20. A device comprising:
a memory storing instructions; and
a hardware processor communicatively coupled to the memory and configured by the instructions to perform operations comprising:
accessing congestion map data and wiring data for a circuit design, the congestion map data describing a set of routing demands for a set of grid cells of the circuit design, the wiring data describing a set of wires for the circuit design;
generating a set of adjusted routing demands, the generating comprising:
determining a set of stack vias for the set of wires based on the wiring data;
adjusting the set of routing demands based on the set of stack vias;
determining a set of via counts that corresponds to the set of grid cells by determining a count of vias in each grid cell of the set of grid cells based on the wiring data; and
adjusting the set of adjusted routing demands based on a set of via density demands, the set of via density demands being determined based on the set of via counts;

modifying the congestion map data based on the set of adjusted routing demands; and performing a detailed routing process on the circuit design based on the congestion map data.

\* \* \* \* \*